United States Patent
Kim (10) Patent No.: US 12,438,020 B2
(45) Date of Patent: Oct. 7, 2025

(54) SUBSTRATE PROCESSING APPARATUS

(71) Applicant: TES CO., LTD, Yongin-si (KR)

(72) Inventor: Jin-Hyung Kim, Yongin-si (KR)

(73) Assignee: TES CO., LTD, Yongin-si (KR)

( * ) Notice: Subject to any disclaimer, the term of this patent is extended or adjusted under 35 U.S.C. 154(b) by 0 days.

(21) Appl. No.: 18/767,916

(22) Filed: Jul. 9, 2024

(65) Prior Publication Data

US 2025/0022730 A1 Jan. 16, 2025

(30) Foreign Application Priority Data

Jul. 14, 2023 (KR) ........................ 10-2023-0091542

(51) Int. Cl.
*H01L 21/67* (2006.01)
*H01L 21/673* (2006.01)

(52) U.S. Cl.
CPC .. *H01L 21/67259* (2013.01); *H01L 21/67034* (2013.01); *H01L 21/67333* (2013.01)

(58) Field of Classification Search
CPC ......... H01L 21/67034; H01L 21/67207; H01L 21/67748; H01L 21/67259; H01L 21/67333; H01L 21/68707; B08B 11/02; B25J 11/0095; B25J 15/0014; B25J 15/0019
See application file for complete search history.

(56) References Cited

U.S. PATENT DOCUMENTS

| | | | | |
|---|---|---|---|---|
| 9,972,519 | B2 * | 5/2018 | Yuk | H01L 21/681 |
| 10,634,994 | B2 * | 4/2020 | Asano | G03F 7/0002 |
| 10,737,286 | B2 * | 8/2020 | Giusti | B05C 11/1018 |
| 2012/0249992 | A1 * | 10/2012 | Matsuura | H01L 21/68707 |
| | | | | 355/72 |
| 2020/0411336 | A1 * | 12/2020 | Sumi | H01L 21/68785 |
| 2021/0391196 | A1 * | 12/2021 | Kim | H01L 21/67766 |
| 2022/0108911 | A1 * | 4/2022 | Murata | H01L 21/681 |
| 2022/0206031 | A1 * | 6/2022 | Choi | H01L 21/67253 |
| 2022/0254658 | A1 * | 8/2022 | Fukui | H01L 21/681 |
| 2022/0395986 | A1 * | 12/2022 | Blank | B25J 9/042 |

FOREIGN PATENT DOCUMENTS

| | | |
|---|---|---|
| KR | 20-2013-0003728 U | 6/2013 |
| KR | 10-2022-0114485 A | 8/2022 |

* cited by examiner

*Primary Examiner* — Gregory W Adams
(74) *Attorney, Agent, or Firm* — Park, Kim & Suh, LLC (57) ABSTRACT

The present disclosure relates to a substrate processing apparatus, and more particularly, to a substrate processing apparatus for detecting tilting or offset of a tray supporting a substrate when a processing process such as a drying process for a substrate using supercritical fluid.

14 Claims, 10 Drawing Sheets

SUBSTRATE PROCESSING APPARATUS

CROSS-REFERENCE TO RELATED APPLICATION

This application is based on and claims priority under 35 U.S.C. § 119 to Korean Patent Application No. 10-2023-0091542, filed on Jul. 14, 2023, in the Korean Intellectual Property Office, the disclosure of which is incorporated by reference herein in its entirety.

TECHNICAL FIELD

The present disclosure relates to a substrate processing apparatus, and more particularly, to a substrate processing apparatus for detecting tilting or offset of a tray supporting a substrate when a processing process such as a drying process for the substrate using supercritical fluid.

BACKGROUND

In general, when large-scale/high-density semiconductor devices such as large-scale integration (LSI) are manufactured on a surface of a semiconductor wafer, it is necessary to form an ultrafine pattern on the surface of the wafer.

These ultrafine patterns may be formed by performing various processes of exposing, developing, and cleaning a wafer coated with resist, patterning the resist, and then etching the wafer to transfer the resist pattern to the wafer.

After this etching, the wafer is cleaned to remove dust or natural oxide films on the wafer surface. The cleaning process is performed by immersing the wafer with a surface on which a pattern is formed in a treatment liquid such as a chemical solution or a rinse liquid or by supplying the treatment liquid to the wafer surface.

However, as semiconductor devices become more highly integrated, pattern collapse, in which the pattern on the resist or the wafer surface collapses, occurs when the treatment liquid is dried after cleaning.

Figure 9:
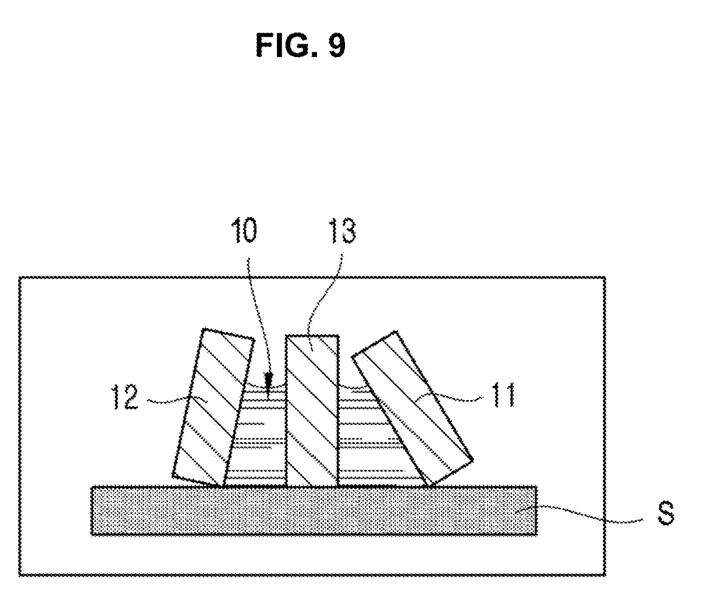
FIG. 9 is a schematic diagram showing a state in which a pattern collapses when a pattern on a substrate is dried according to the related art.

This pattern collapse corresponds to a phenomenon in which patterns 11, 12, and 13 collapse toward a side at which a large amount of the treatment liquid remains due to an imbalance in the capillary force of stretching the patterns 11, 12, and 13 to the left and right when the treatment liquid on the left and right sides of the patterns 11, 12, and 13 dries unevenly during the process of drying a treatment liquid 10 remaining on a surface of a substrate S after cleaning as shown in FIG. 9.

FIG. 9 shows a state in which a treatment liquid in left and right outer regions of an upper surface of the substrate S, in which a pattern is not formed, is completely dried, while the treatment liquid 10 remains in a gap between the patterns 11, 12, and 13. As a result, the patterns 11 and 13 on both the left and right sides collapse toward the inside due to the capillary force received from the treatment liquid 10 remaining between the patterns 11, 12, and 13.

The capillary force causing the pattern collapse described above is caused by an atmospheric atmosphere surrounding the substrate S after cleaning and a surface tension of the treatment liquid functioning at a liquid/gas interface with the treatment liquid remaining between patterns.

Therefore, recently, a treatment method of drying the treatment liquid by using a fluid in a supercritical state (hereinafter referred to as 'supercritical fluid') in which an interface between gas or liquid is not formed has attracted attention.

Figure 10:
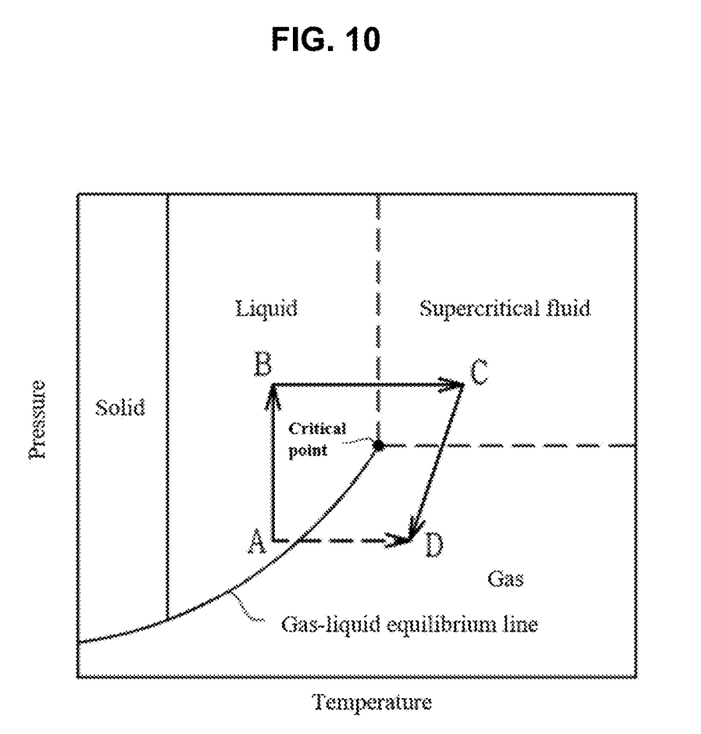
FIG. 10 is a state diagram showing pressure and temperature changes in a fluid in a processing process using a supercritical fluid.

In a conventional drying method using only temperature control in a pressure and temperature phase diagram of FIG. 10, a gas-liquid equilibrium line is necessarily passed as shown by a hidden line, and in this case, capillary force is generated at a gas-liquid interface.

In contrast, when a fluid is dried through a supercritical state by using both temperature and pressure control of the fluid, a gas-liquid equilibrium line is not passed, and thus it is possible to dry a substrate in a state essentially free of capillary force.

With regard to drying using a supercritical fluid with reference to FIG. 10, when the pressure of a liquid is raised from A to B and the temperature is then raised from B to C, the liquid is converted into a supercritical state C without passing the gas-liquid equilibrium line. When the drying process is completed, the pressure of the supercritical fluid is lowered and converted to gas D without passing the gas-liquid equilibrium line.

As described above, the conventional device that performs a processing process such as a drying process for a substrate by using a supercritical fluid includes a tray on which the substrate is accommodated, and the tray moves inside the chamber to proceed with the process. In this case, when the tray is aligned and located in the correct position of the center in vertical and horizontal directions within the chamber, the process on the substrate may be performed more effectively. However, there may be cases in which the tray is not aligned in the correct position due to various factors.

For example, one end of the tray is fixed to a cover that seals the opening of the chamber, and the other end of the tray corresponds to a free end that is not fixed. Therefore, as the process progresses, the other end of the tray that is not fixed may sag due to a self-load, causing tilting. When the tray is introduced into the chamber, the tray may be introduced tilted to one side in a horizontal plane.

As such, when a distance between the tray and a bottom surface, ceiling, and inner wall inside the chamber is not kept constant and changes, the tray may deviate from a normal position and the organic solvent 10 on the substrate S may not properly protect a pattern on an upper surface of the substrate S, causing damage to the pattern.

It causes an imbalance in a flow of fluid supplied into the chamber, preventing the flow energy of the fluid from being uniformly transmitted toward the substrate S. In this case, the flow energy of the fluid is not transmitted to an upper surface of the substrate S, and as a result, the organic solvent 10, such as isopropyl alcohol (IPA), existing between the patterns 12 of the substrate S may not be properly replaced.

SUMMARY

To overcome the above problem, an object of the present disclosure is to provide a substrate processing apparatus that aligns a tray on which a substrate is accommodated at a correct position within a chamber.

The present disclosure provides a substrate processing apparatus for detecting tilting or offset of a tray on which a substrate is accommodated.

According to an aspect of the present disclosure, a substrate processing apparatus includes a chamber providing a processing space for performing a processing process on a substrate coated with an organic solvent by using a fluid in a supercritical state, a tray that supports the substrate and is to be retracted into the chamber and extended out of the chamber through an opening of the chamber, and a detection sensor configured to detect tilting or offet of the tray, wherein the detection sensor includes at least one of a first detection sensor configured to detect tilting of the tray based on a first axis (X axis) parallel to a horizontal plane, a second detection sensor configured to detect tilting of the tray based on a second axis (Y axis) parallel to the horizontal plane, and a third detection sensor configured to detect movement of the tray in the direction of the first axis (X axis).

The first detection sensor may include a first tray detection sensor configured to detect a vertical distance to a lower surface of the tray and a first chamber detection sensor configured to detect a vertical distance to a lower surface of an outside of the chamber.

A first distance between the lower surface of the tray and a base of the processing space may be calculated using [Equation 1] below;

$$\text{First distance} = \text{fourth distance} - (\text{fifth distance} + \text{sixth distance}) \quad [\text{Equation 1}]$$

where the fourth distance corresponds to a vertical distance to the lower surface of the tray measured by the first tray detection sensor, the fifth distance corresponds to a vertical distance to the lower surface of the outside of the chamber measured by the first chamber detection sensor, and the sixth distance corresponds to a thickness of the base of the chamber;

The substrate processing apparatus may further include a controller, and the controller may determine whether the tray is tilted based on the first axis (X axis) by comparing the calculated first distance with a predetermined critical range.

The substrate processing apparatus may further include a controller, wherein a fourth distance to the lower surface of the tray may be measured by the first tray detection sensor while the tray moves, and a degree of sagging of the tray may be determined by comparing a fourth distance measured by the first tray detection sensor with a predetermined reference value.

The first tray detection sensor may measure the fourth distance to the lower surface of the tray continuously or repeatedly at predetermined time intervals while the tray moves toward the chamber or while the tray moves away from the chamber.

The second detection sensor may include a second tray detection sensor configured to detect a vertical distance to an end of one side of the tray and a second chamber detection sensor configured to detect a vertical distance to an end of another end of the chamber.

The end of the one side and the end of the other end of the tray may correspond to ends spaced apart from each other along the first axis (X axis).

The substrate processing apparatus may further include a controller, wherein the controller may determine whether the tray is tilted based on the second axis (Y axis) by comparing a seventh distance measured by the second tray detection sensor with an eighth distance measured by the second chamber detection sensor.

The third detection sensor may include a third tray detection sensor configured to detect a horizontal distance to one lateral surface of the tray and a third chamber detection sensor configured to detect a horizontal distance to one lateral surface of an outside of the chamber.

A third distance between the one lateral surface of the tray and an inner wall of the processing space may be calculated using [Equation 2] below, $$\text{Third distance} = \text{ninth distance} - (\text{tenth distance} + \text{eleventh distance}) \quad [\text{Equation 2}]$$

where the ninth distance corresponds to a horizontal distance to the one lateral surface of the tray measured by the third tray detection sensor, the tenth distance corresponds to a horizontal distance to the one lateral surface of the outside of the chamber measured by the third chamber detection sensor, and the eleventh distance corresponds to a thickness of a lateral wall of the chamber The substrate processing apparatus may further include a controller, and the controller may determine whether the tray is tilted based on the first axis (X axis) by comparing the calculated third distance with a predetermined critical range.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, a structure of a substrate processing apparatus according to an embodiment of the present disclosure will be examined in detail with reference to the drawings.

Figure 1:
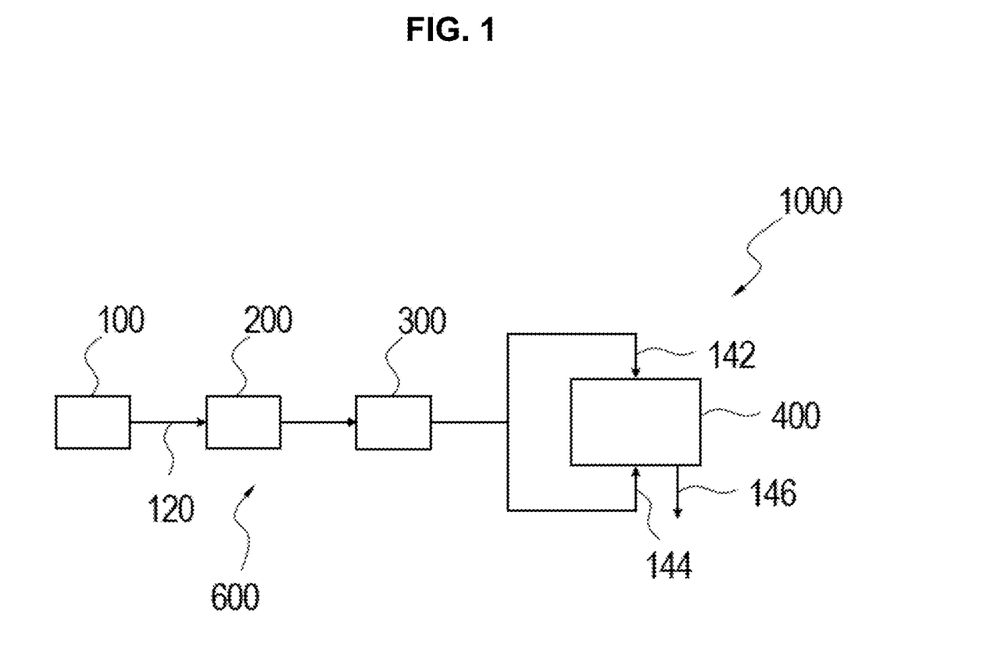
FIG. 1 is a block diagram showing a configuration of a substrate processing apparatus using a supercritical fluid according to an embodiment of the present disclosure.
Figure 2:
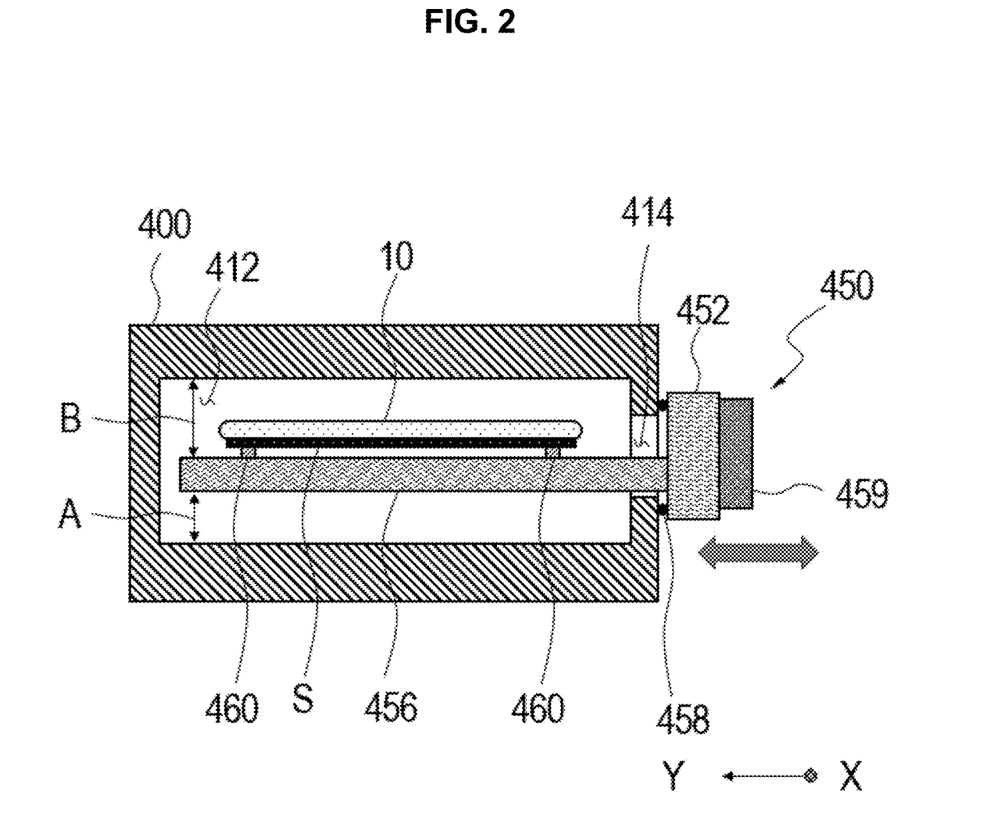
FIG. 2 is a side cross-sectional view showing a configuration of a chamber in FIG. 1.

FIG. 1 is a block diagram showing a configuration of a substrate processing apparatus 1000 using a supercritical fluid according to the present disclosure, and FIG. 2 is a side cross-sectional view showing a configuration of a chamber 400.

The substrate processing apparatus 1000 using a supercritical fluid according to the present disclosure performs a processing process on a substrate S by using a fluid in a supercritical state. Here, a fluid in a supercritical state corresponds to a fluid with a phase in which a material reaches a critical state, that is, a state exceeding a critical temperature and a critical pressure. The fluid in a supercritical state has a molecular density close to that of a liquid, but a viscosity close to that of a gas. Therefore, since the fluid in a supercritical state has excellent diffusion, penetration, and dissolving power, which is advantageous for chemical reactions and does not apply surface tension to a microstructure due to almost no surface tension, the fluid in a supercritical state not only has excellent drying efficiency during a drying process of semiconductor devices, but also is capable of avoiding pattern collapse, and thus may be very useful.

In the present disclosure, carbon oxide ($CO_2$) may be used as a supercritical fluid. Carbon dioxide has a critical temperature of approximately 31.1° C. and a relatively low critical pressure of 7.38 Mpa, and thus it is advantageous that carbon dioxide is easily converted to a supercritical state, the state of carbon dioxide is controlled by adjusting the temperature and the pressure thereof, and carbon dioxide is inexpensive.

Carbon dioxide is non-toxic, harmless to the human body, and has properties of being non-flammable and inert. Since carbon dioxide in a supercritical state has a diffusion coefficient that is approximately 10 to 100 times higher than that of water or other organic solvents, carbon dioxide has excellent permeability, allows rapid substitution of organic solvents, and has almost no surface tension, and thus has properties that are advantageous for use in a drying process. It is possible to convert carbon dioxide used in the drying process into a gaseous state, separate the organic solvent, and reuse the same, thus reducing a burden in terms of environmental pollution.

Referring to FIGS. 1 and 2, the substrate processing apparatus 1000 may include the chamber 400 that provides a processing space 412 in which a processing process for the substrate S coated with a treatment liquid or organic solvent 10 (hereinafter referred to as 'organic solvent') by using a liquid in a supercritical state, and a fluid supply unit 600 that supplies a fluid into the chamber 400.

The fluid supply unit 600 may supply a fluid to the chamber 400 through a main supply line 120 by adjusting at least one of the temperature and pressure of the fluid.

For example, the fluid supply unit 600 may include a fluid storage unit 100 that stores the fluid, and the main supply line 120 connecting the fluid storage unit 100 and the chamber 400 to each other.

In this case, a pressure controller 200 and a temperature controller 300 may be located along the main supply line 120. The order of the pressure controller 200 and the temperature controller 300 in the main supply line 120 shows an example, and in the main supply line 120, the position of the temperature controller 300 and the position of the pressure controller 200 may be interchangeable.

In this case, the pressure controller 200 may include, for example, a pressure pump, and the temperature controller 300 may include a heater heating the fluid or a heat exchanger.

The main supply line 120 may further include a detector (not shown) that detects at least one of the pressure and temperature of the fluid. The pressure and temperature of the fluid flowing in the main supply line 120 may be adjusted according to the pressure and temperature detected by the detector. To this end, the substrate processing apparatus 1000 according to an embodiment of the present disclosure may include a controller (not shown) that controls the pressure controller 200 and the temperature controller 300. The controller may control the pressure controller 200 and the temperature controller 300 based on the pressure and temperature detected by the detector.

When a processing process is performed on the substrate S, the temperature and pressure of the processing space 412 of the chamber 400 need to be maintained above the critical temperature and critical pressure to convert the fluid supplied into the chamber 400 into a supercritical state.

To this end, while the fluid moves along the main supply line 120, the fluid may be pressurized to a critical pressure or higher by the temperature controller 300, and also the fluid may be heated to a critical temperature or higher by the temperature controller 300.

The main supply line 120 may be branched and may include a first supply line 142 connected to an upper side of the chamber 400 and a second supply line 144 connected to a lower side of the chamber 400. In this case, although not shown in the drawing, the first supply line 142 and the second supply line 144 are each provided with a valve to control supply of fluid.

When fluid is supplied from beginning of the process through an upper side of the chamber 400, high-pressure fluid may be supplied from the upper side of the chamber 400 towards the substrate S. In this case, the pattern (not shown) formed above the substrate S may be damaged by high-pressure fluid. Therefore, at the beginning of the process, fluid is supplied from a lower side of the chamber 400 through the second supply line 144 to prevent damage to the pattern on the substrate S. After an internal pressure of the chamber 400 reaches a process pressure, fluid may be supplied from the upper side of the chamber 400 through the first supply line 142.

The chamber 400 may further include a discharge line 146 for discharging the fluid in the processing space 412 to the outside. During the processing process for the substrate S or when the processing process is completed, fluid may be discharged from the inside of the chamber 400 to the outside through the discharge line 146.

The chamber 400 may provide the processing space 412 for performing a processing process such as a drying process on the substrate S by using a fluid in a supercritical state.

The chamber 400 may have an opening 414 formed at one side and may be formed of a material to process a high-pressure process for the substrate S inside the chamber 400.

The processing space 412 of the chamber 400 is maintained in a sealed state, and thus the pressure of the fluid supplied to the processing space 412 may be maintained above the critical pressure.

The chamber 400 may further include a heater (not shown) to maintain the temperature of the processing space 412 above a certain temperature. The heater may maintain the temperature of the processing space 412 or the temperature of the fluid accommodated in the processing space 412 above a critical temperature during the process for the substrate S.

The chamber 400 may include a substrate support unit for supporting the support S. According to the present embodiment, the substrate support unit may include a tray unit 450.

The tray unit 450 may be retracted into the processing space 412 of the chamber 400 through the opening 414 or may be extended out of the processing space 412 to the outside of the chamber 400 through the opening 414.

For example, the tray unit 450 may have a support 460 protruding to support the substrate S and include a tray 456 to be retracted into the tray 400 through the opening 414 of the chamber 400 and to be extended out of the tray 400, and a cover 452 that is provided at one end of the tray 456 to seal the opening 414.

The tray 456 may have an upper surface on which the substrate S is accommodated and supported. A plurality of supports 460 may be formed on the upper surface of the tray 456 to support the substrate S. The substrate S may be accommodated at an upper end of the support 460 to be supported.

The cover 452 may be connected to one end of the tray 456.

When the tray 456 is inserted into the processing space 412 through the opening 414, the cover 452 seals the opening 414. In this case, a sealing member 458 may be provided for sealing a space between the cover 452 and the chamber 400.

When the opening 414 is sealed by the cover 452, a high-pressure process is performed inside the chamber 400 by using a supercritical fluid, and thus there is a need for a component for preventing the cover 452 from being pushed by the pressure inside the chamber 400.

For example, provided may be a shutter 459 that pressurizes the cover 452 to prevent the cover 452 from being pushed by the pressure inside the chamber 400. The shutter 459 prevents the cover 452 from being pushed during the process by pressing the cover 452 when the tray 456 is inserted into the processing space 412 and the opening 414 is blocked by the cover 452. The shutter 459 may move vertically from the top or the bottom to press the cover 452 toward the chamber 400 from an outer surface of the cover 452. As such, the configuration for pressurizing the cover 452 is described as an example, and may be applied in various modifications.

In the above-described configuration, when the tray 456 is coupled to the chamber 400, it is important that the tray 456 is aligned and located in the correct position of the center of the chamber 400 in vertical and horizontal directions.

For example, it is important to keep constant a first distance A between a lower surface of the tray 456 and a base of the processing space 412 and a second distance B between the upper surface of the tray 456 and the ceiling of the processing space 412. When the above-described first distance A and second distance B are changed, the organic solvent 10 on the upper surface of the substrate S may be tilted to one side and may not protect the pattern. Hereinafter, the tilting and offset of the tray 456 will be examined in detail with reference to the drawings.

Figure 3:
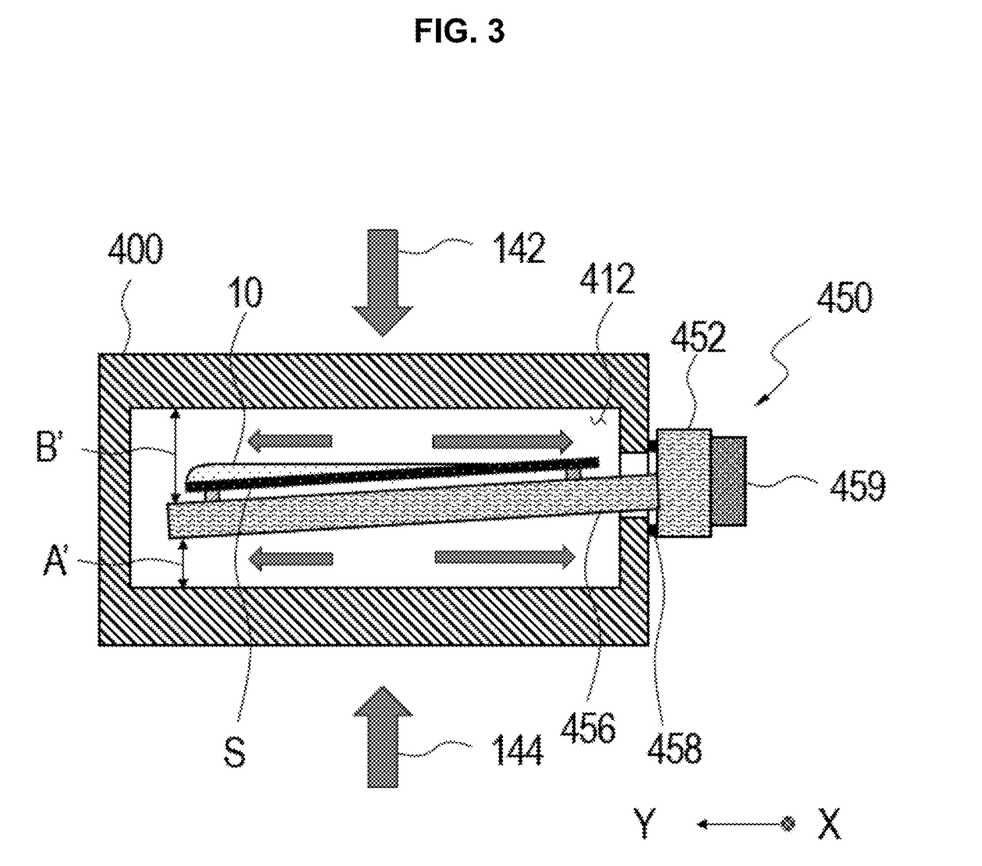
FIG. 3 is a side view showing a case in which a tray is tilted relative to a first axis (X-axis) parallel to a horizontal plane.
Figure 4:
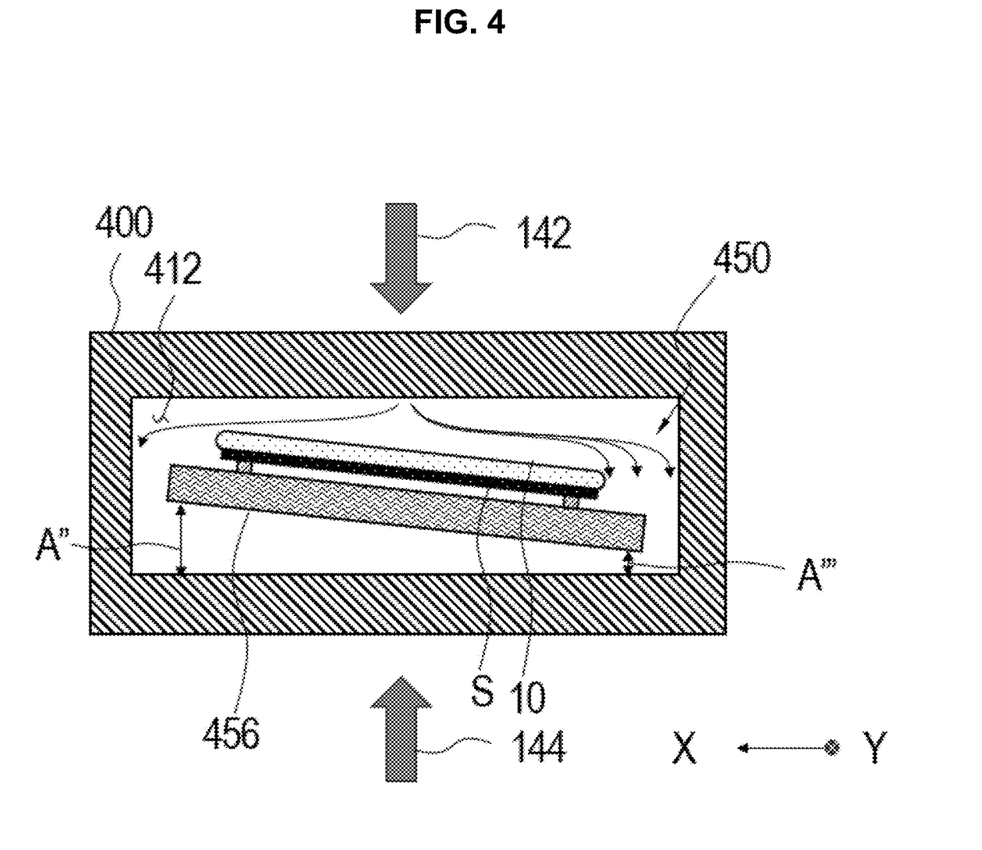
FIG. 4 is a front view showing a case in which a tray is tilted relative to a second axis (Y-axis) parallel to a horizontal plane.
Figure 5:
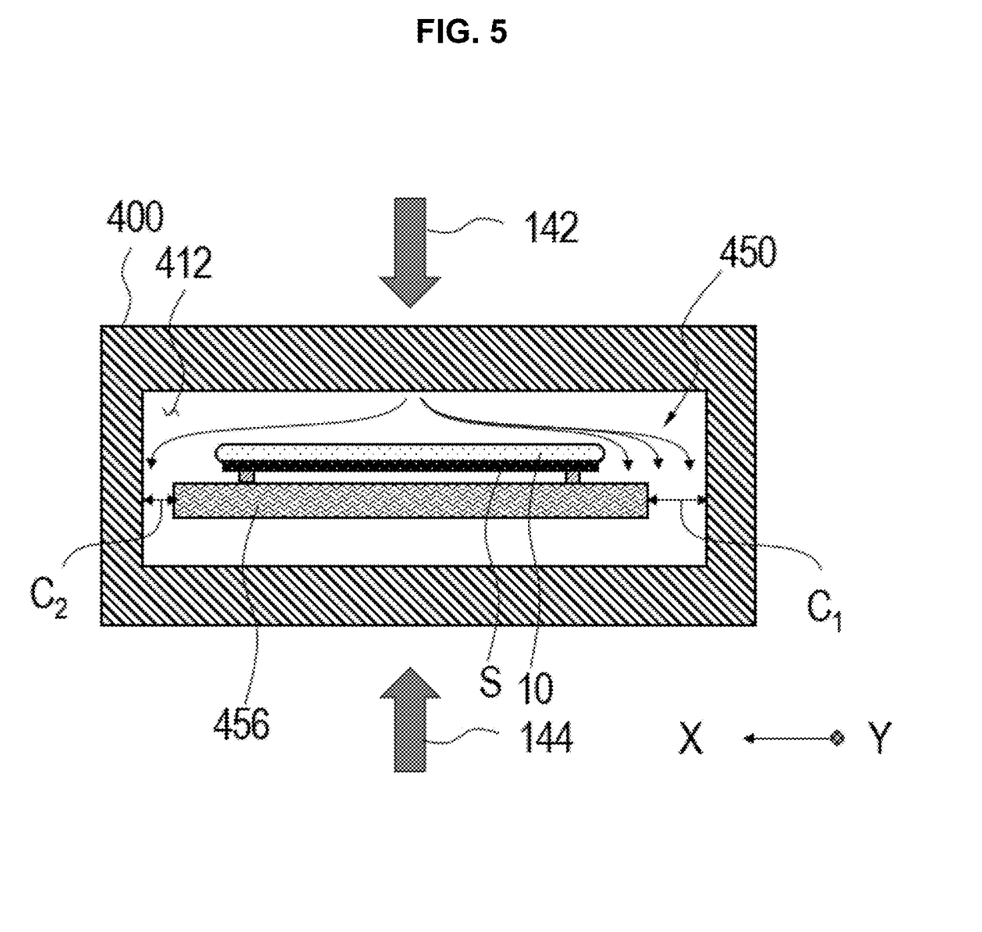
FIG. 5 is a front view showing a case in which a tray moves in a first axis (X axis) direction and is tilted to one side.

FIGS. 3 to 5 are diagrams showing a case in which the tray 456 is tilted within the chamber 400 or shifted to one side within the chamber 400.

First, FIG. 3 is a side view showing a case in which the tray 456 is tilted relative to a first axis (X-axis) parallel to a horizontal plane.

Referring to FIG. 3, one end of the tray 456 corresponds to a fixed end connected to and fixed to the cover 452 as described above, and the other end of the tray 456 corresponds to a free end that is not fixed. Therefore, as the process for the substrate S is repeated, the other end corresponding to the free end of the tray 456 may sag and tilt due to a self weight. Tilting of the tray 456 may occur due to high-pressure fluid supplied into the chamber 400.

As such, when tilting occurs in the tray 456, the above-described first distance A' and second distance B' are not maintained constant, but change due to tilting of the tray 456.

As a result, tilting of the tray 456 may cause loss of the organic solvent 10 above the substrate S, which may prevent the pattern on the upper surface of the substrate S from being properly protected, causing damage to the pattern. It causes an imbalance in a flow of fluid supplied into the chamber 400, preventing the flow energy of the fluid from being uniformly transmitted toward the substrate S. In this case, when the flow energy of the fluid is not transmitted or is not transmitted uniformly to the upper surface of the substrate S, the organic solvent 10 such as isopropyl alcohol (IPA) existing between the patterns (not shown) of the substrate S may not be replaced appropriately.

FIG. 4 is a front view showing a case in which the tray 456 is tilted relative to a second axis (Y-axis) parallel to a horizontal plane. Here, the second axis (Y axis) may correspond to a direction perpendicular to the above-described first axis (X axis) on a plane.

Referring to FIG. 4, when the tray 456 is retracted into the chamber 400, the tray 456 may be tilted and coupled based on the second axis.

In this case, as shown in FIG. 4, the tray 456 may be tilted based on the second axis (Y-axis) and the above-described first distances A" and A'" from right and left sides of the tray 456 may be different from each other. Although not shown in the drawing, the above-described second distances on the right and left sides of the tray 456 may also be different from each other.

As a result, in this case as well, as seen in FIG. 3, the pattern of the substrate S may be damaged due to loss of the organic solvent 10 or the organic solvent 10 may not be properly replaced.

FIG. 5 is a front view showing a case in which the tray 456 moves in the above-described first axis (X axis) direction and is tilted to one side within the processing space 412.

Referring to FIG. 5, when the tray 456 is coupled to the chamber 400, the tray 456 may be tilted and coupled to one side due to various factors. FIG. 5 shows a case in which the tray 456 moves parallel to the first axis (X axis) and is tilted and coupled.

Accordingly, with regard to a third distance between the tray 456 and an inner wall of the processing space 412, it may be seen that a third distance C1 between the tray 456 and one inner wall is larger than a third distance C2 between the tray 456 and the other inner wall.

In this case, as shown in the drawing, an imbalance may occur in the flow of fluid supplied into the chamber 400, and thus the flow energy of the fluid may not be uniformly transmitted toward the substrate S. Thus, the flow energy of the fluid is not transmitted to an upper surface of the substrate S, and the organic solvent 10, such as isopropyl alcohol (IPA), existing between patterns (not shown) of the substrate S may not be properly replaced.

Hereinafter, the substrate processing apparatus 1000 including detection sensors 510, 520, and 610 for detecting tilting or offset of the tray 456 described above will be described.

Figure 6:
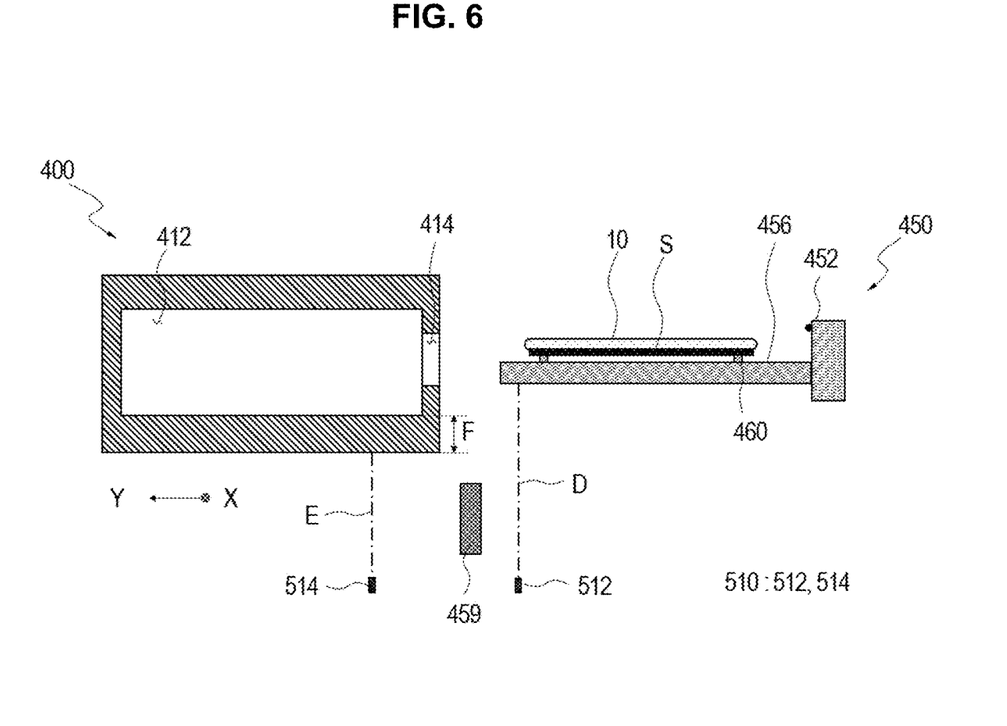
FIG. 6 is a side view of a chamber including a first detection sensor for detecting tilting of a tray with respect to a first axis (X axis) parallel to a horizontal plane.

FIG. 6 is a side view of the chamber 400 including the first detection sensor 510 for detecting tilting of the tray 456 with respect to the first axis (X axis) parallel to a horizontal plane.

Referring to FIG. 6, the first detection sensor 510 may include a first tray detection sensor 512 that detects a vertical distance (or height) to a lower surface of the tray 456 when the tray 456 is separated from the chamber 400 and a first chamber detection sensor 514 that detects a vertical distance (or height) to a lower surface of the outside of the chamber 400.

In this case, the first tray detection sensor 512 and the first chamber detection sensor 514 may be arranged on the same horizontal plane or may be arranged to have the same height.

Therefore, when the tray 456 is separated from the chamber 400, a fourth distance D to the lower surface of the tray 456 may be measured by the first tray detection sensor 512. A fifth distance E to the lower surface of the outside of the chamber 400 may be measured by the first chamber detection sensor 514. Here, the aforementioned first distance A between the lower surface of the tray 456 and the base of the processing space 412 may be defined as [Equation 1] below.

$$\text{First distance } A = \text{fourth distance } D - (\text{fifth distance } E + \text{sixth distance } F) \quad [\text{Equation 1}]$$

Here, the sixth distance F corresponds to a thickness of the base of the chamber 400, which may be predetermined and stored in the controller described above when the chamber 400 is manufactured.

Therefore, when the tray 456 is separated from the chamber 400, the controller may measure the fourth distance D and the fifth distance E by the first tray detection sensor 512 and the first chamber detection sensor 514 to calculate the first distance A by using [Equation 1] above.

The controller may determine whether the tray 456 is tilted relative to the first axis (X axis) by comparing the calculated first distance A with a predetermined threshold range. For example, when the calculated first distance A is within a critical range, the process continues, and in contrast, when the calculated first distance A is outside the critical range, the process may be stopped, and various signals may be used to indicate that tilting occurs in the tray 456.

When provided with the first tray detection sensor 512, the fourth distance D to the lower surface of the tray 456 may be measured by the first tray detection sensor 512 while the tray 456 moves.

That is, while the tray 456 moves toward the chamber 400 or while the tray 456 moves away from the chamber 400, the first tray detection sensor 512 may measure the fourth distance D to the lower surface of the tray 456.

Here, the first tray detection sensor 512 may measure the fourth distance D to the lower surface of the tray 456 continuously or repeatedly at predetermined time intervals.

In this case, a degree of sagging of the tray 456 may be determined by comparing the fourth distance D measured by the first tray detection sensor 512 with a reference value. Through this process, when the fourth distance D to the tray 456 is determined to be outside the critical range from the reference value, the controller may stop a subsequent process by the tray 456.

For example, while the process for the substrate S is completed and the tray 456 is separated from the chamber 400 and moves, when a value of the fourth distance D measured by the first tray detection sensor 512 is outside the critical range, the controller may stop a subsequent process for the substrate.

Figure 7:
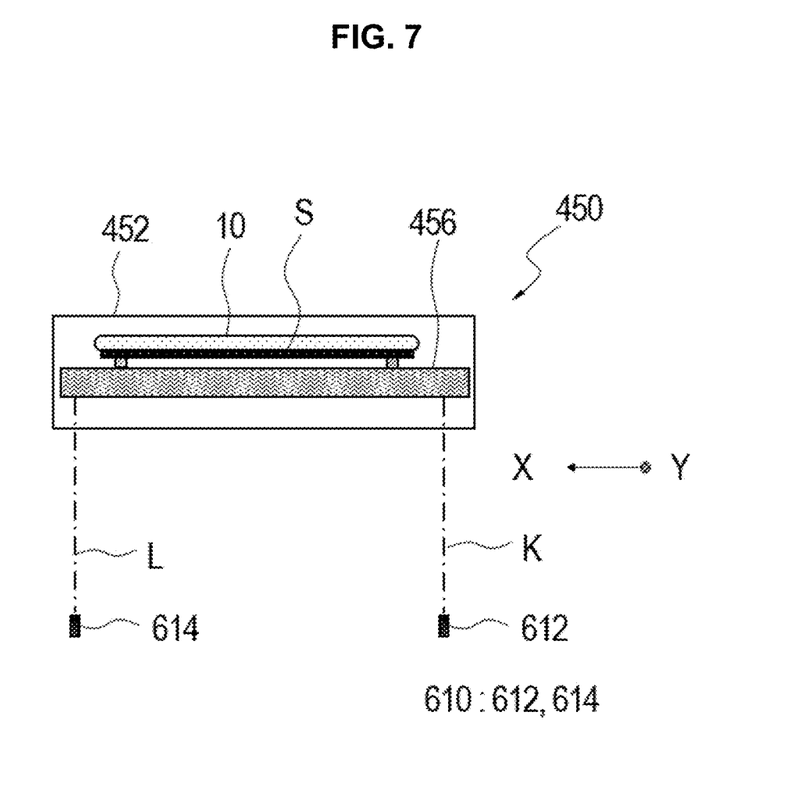
FIG. 7 is a front view of a chamber including a second detection sensor for detecting tilting of a tray with respect to a second axis (Y axis) parallel to a horizontal plane.

FIG. 7 is a front view of the tray unit 450 including the second detection sensor 610 for detecting tilting of the tray 456 with respect to the second axis (Y axis) parallel to a horizontal plane.

Referring to FIG. 7, the second detection sensor 610 may include a second tray detection sensor 612 that detects a vertical distance (or height) to one end of the tray 456 and a second chamber detection sensor 614 that detects a vertical distance (or height) to the other end of the tray 456. Here, one end and the other end of the tray 456 correspond to ends spaced apart from each other along the first axis (X axis).

Therefore, when the tray 456 is separated from the chamber 400, the controller may measure a seventh distance K and an eighth distance L through the second tray detection sensor 612 and the second chamber detection sensor 614, respectively.

In this case, the controller may determine whether the tray 456 is tilted based on the second axis (Y axis) by comparing the measured seventh distance K with the measured eighth distance L. For example, when a difference between the measured seventh distance K and eighth distance L is within a critical range, the process continues, and in contrast, when the difference between the measured seventh distance K and eighth distance L is outside the critical range, the process may be stopped, and various signals may be used to indicate that tilting occurs in in the tray 456.

Figure 8A:
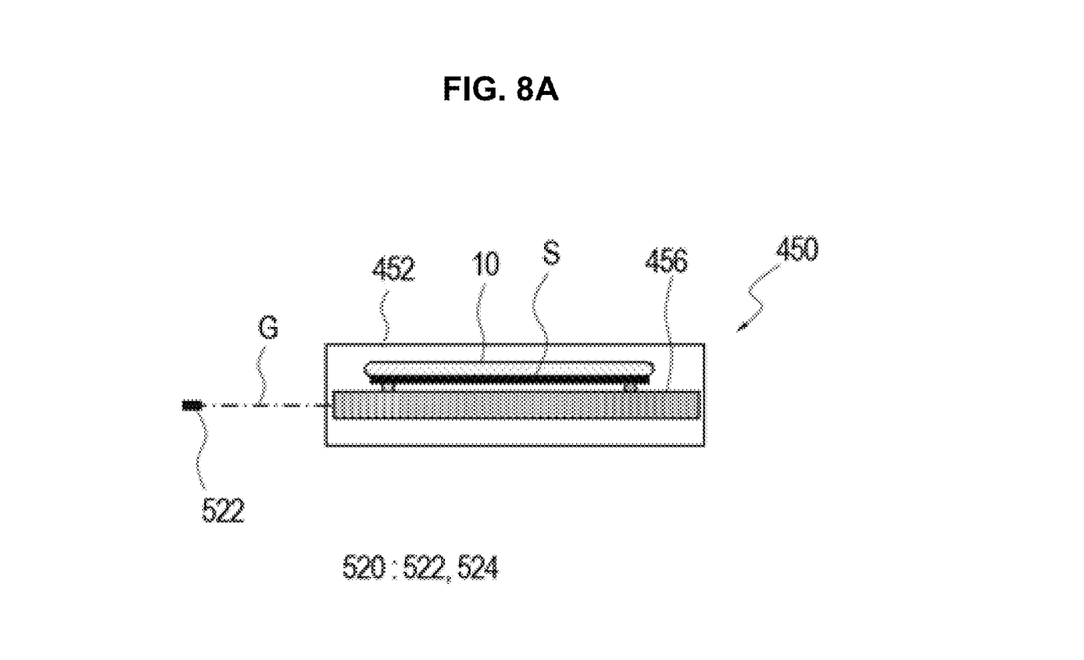
FIGS. 8A and 8B are front views showing the chamber including a third detection sensor that detects movement of a tray in a first axis (X axis) direction.
Figure 8B:
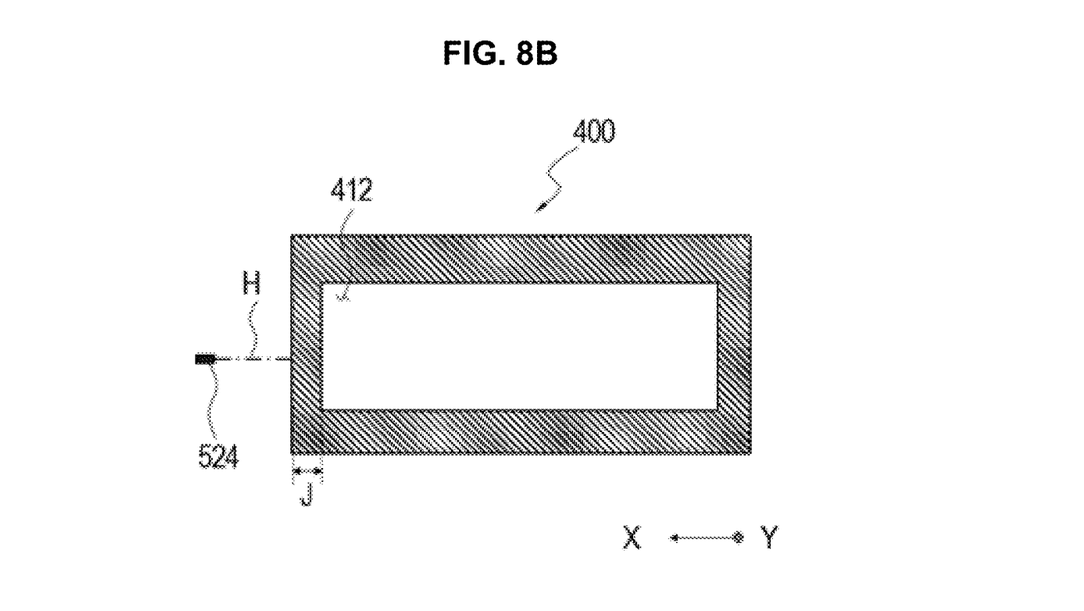

FIGS. 8A and 8B are front views showing the tray unit 450 and the chamber 400 including the third detection sensor 520 that detects movement of the tray 456 in the first axis (X axis) direction. FIG. 8A is a front view of the tray unit 450, and FIG. 8B is a front view of the chamber 400.

Referring to FIGS. 8A and 8B, the third detection sensor 520 may include a third tray detection sensor 522 that detects a horizontal distance to one lateral surface of the tray 456, and a third chamber detection sensor 524 that detects a horizontal distance to one lateral surface of the outside of the chamber 400.

Here, the third tray detection sensor 522 and the third chamber detection sensor 524 may be arranged to be spaced apart from each other by the same distance in the chamber 400.

Therefore, when the tray 456 is separated from the chamber 400, a ninth distance G to one lateral surface of the tray 456 may be measured by the third tray detection sensor 522. A tenth distance H to one lateral surface of the outside of the chamber 400 may be measured by the third chamber detection sensor 524. Here, the aforementioned third distance C between the lower surface of the tray 456 and the inner wall of the processing space 412 may be defined as [Equation 2] below.

$$\text{Third distance } C = \text{ninth distance } G - (\text{tenth distance } H + \text{eleventh distance } J) \quad [\text{Equation 2}]$$

Here, the eleventh distance J corresponds to a thickness of a lateral wall of the chamber 400, and more precisely, to a thickness of the lateral wall on which the third tray detection sensor 522 and the third chamber detection sensor 524 are installed. The thickness may be predetermined and stored in the controller described above when the chamber 400 is manufactured.

Therefore, when the tray 456 is separated from the chamber 400, the controller may measure the ninth distance G and the tenth distance H by the third tray detection sensor 522 and the third chamber detection sensor 524 to calculate the third distance C by using [Equation 2] above.

The controller may determine whether the tray 456 is tilted relative to the first axis (X axis) by comparing the calculated third distance C with a predetermined threshold range. For example, when the calculated third distance C is within a critical range, the process continues, and in contrast, when the calculated third distance C is outside the critical range, the process may be stopped, and various signals may be used to indicate that offset occurs in the tray 456.

Although FIGS. 6 to 8B illustrate that the substrate processing apparatus includes the first detection sensor 510, second detection sensor 610, and third detection sensor 520 described above, but the present disclosure is not limited thereto, and the substrate processing apparatus may include at least one of the first detection sensor 510, the second detection sensor 610, and the third detection sensor 520 described above.

According to the present disclosure having the above-described configuration, it may be possible to easily determine whether the tray supporting the substrate is aligned in the correct position within the chamber. The substrate processing process may proceed more smoothly by detecting the tilting or offset of the tray and replacing the tray.

According to the present disclosure, predetermined reference values may be referenced when assembling a substrate processing apparatus, and thus setting and assembling the apparatus may be possible regardless of assembly/processing errors of the apparatus and a skill level of an assembler. Process problems such as deformation and disassembly that may occur due to self-load, pressure, temperature, and the like of the substrate processing apparatus may be prevented in advance.

Although the present disclosure has been described above with reference to exemplary embodiments, those skilled in the art may modify and change the present disclosure in various ways without departing from the spirit and scope of the present disclosure as set forth in the claims described below. Therefore, when the modified implementation basically includes the elements of the claims of the present disclosure, it should be considered to be included in the technical scope of the present disclosure.

What is claimed is:

1. A substrate processing apparatus comprising:
    a chamber providing a processing space for performing a process on a substrate coated with an organic solvent by using a fluid in a supercritical state;
    a tray that supports the substrate and is to be loaded into the chamber and unloaded out of the chamber through an opening of the chamber; and
    a detection sensor configured to detect tilting or offset of the tray,
    wherein the detection sensor includes at least one of a first detection sensor configured to detect tilting of the tray based on a first axis (X axis) parallel to a horizontal plane, a second detection sensor configured to detect tilting of the tray based on a second axis (Y axis) parallel to the horizontal plane, and a third detection sensor configured to detect movement of the tray in the direction of the first axis (X axis),
    wherein the first detection sensor includes a first tray detection sensor configured to detect a vertical distance to a lower surface of the tray and a first chamber detection sensor configured to detect a vertical distance to a lower surface of an outside of the chamber.

2. The substrate processing apparatus of claim 1, wherein a first distance between the lower surface of the tray and a base of the processing space is calculated using [Equation 1] below;

$$\text{First distance} = \text{fourth distance} - (\text{fifth distance} + \text{sixth distance}) \quad [\text{Equation 1}]$$

where the fourth distance corresponds to a vertical distance to the lower surface of the tray measured by the first tray detection sensor, the fifth distance corresponds to a vertical distance to the lower surface of the outside of the chamber measured by the first chamber detection sensor, and the sixth distance corresponds to a thickness of the base of the chamber;
the substrate processing apparatus further includes a controller; and
the controller determines whether the tray is tilted based on the first axis (X axis) by comparing the first distance with a predetermined critical range.

3. The substrate processing apparatus of claim 1, further comprising a controller,
    wherein a fourth distance to the lower surface of the tray is measured by the first tray detection sensor while the tray moves, and
    the controller determines a degree of sagging of the tray by comparing a fourth distance measured by the first tray detection sensor with a predetermined reference value.

4. The substrate processing apparatus of claim 3, wherein the first tray detection sensor measures the fourth distance to the lower surface of the tray continuously or repeatedly at predetermined time intervals while the tray moves toward the chamber or while the tray moves away from the chamber.

5. The substrate processing apparatus of claim 1, wherein the second detection sensor includes a second tray detection sensor configured to detect a vertical distance to an end of one side of the tray and a second chamber detection sensor configured to detect a vertical distance to an end of another end of the chamber.

6. The substrate processing apparatus of claim 5, wherein the end of the one side and the end of the other end of the tray correspond to ends spaced apart from each other along the first axis (X axis).

7. The substrate processing apparatus of claim 5, further including a controller,
    wherein the controller determines whether the tray is tilted based on the second axis (Y axis) by comparing a seventh distance measured by the second tray detection sensor with an eighth distance measured by the second chamber detection sensor.

8. The substrate processing apparatus of claim 1, wherein the third detection sensor includes a third tray detection sensor configured to detect a horizontal distance to one lateral surface of the tray and a third chamber detection sensor configured to detect a horizontal distance to one lateral surface of an outside of the chamber.

9. The substrate processing apparatus of claim 8, wherein a third distance between the one lateral surface of the tray and an inner wall of the processing space is calculated using [Equation 2] below, $$\text{Third distance} = \text{ninth distance} - (\text{tenth distance} + \text{eleventh distance}) \quad [\text{Equation 2}]$$

where the ninth distance corresponds to a horizontal distance to the one lateral surface of the tray measured by the third tray detection sensor, the tenth distance corresponds to a horizontal distance to the one lateral surface of the outside of the chamber measured by the third chamber detection sensor, and the eleventh distance corresponds to a thickness of a lateral wall of the chamber;
the substrate processing apparatus further includes a controller; and
the controller determines whether the tray is tilted based on the first axis (X axis) by comparing the calculated third distance with a predetermined critical range.

10. A substrate processing apparatus comprising:
a chamber providing a processing space for performing a process on a substrate coated with an organic solvent by using a fluid in a supercritical state;
a tray that supports the substrate and is to be loaded into the chamber and unloaded out of the chamber through an opening of the chamber; and
a detection sensor configured to detect tilting or offset of the tray,
wherein the detection sensor includes at least one of a first detection sensor configured to detect tilting of the tray based on a first axis (X axis) parallel to a horizontal plane, a second detection sensor configured to detect tilting of the tray based on a second axis (Y axis) parallel to the horizontal plane, and a third detection sensor configured to detect movement of the tray in the direction of the first axis (X axis),
wherein the second detection sensor includes a second tray detection sensor configured to detect a vertical distance to an end of one side of the tray and a second chamber detection sensor configured to detect a vertical distance to an end of another end of the chamber.

11. The substrate processing apparatus of claim 10, wherein the end of the one side and the end of the other end of the tray correspond to ends spaced apart from each other along the first axis (X axis).

12. The substrate processing apparatus of claim 10, further including a controller,
wherein the controller determines whether the tray is tilted based on the second axis (Y axis) by comparing a seventh distance measured by the second tray detection sensor with an eighth distance measured by the second chamber detection sensor.

13. A substrate processing apparatus comprising:
a chamber providing a processing space for performing a process on a substrate coated with an organic solvent by using a fluid in a supercritical state;
a tray that supports the substrate and is to be loaded into the chamber and unloaded out of the chamber through an opening of the chamber; and
a detection sensor configured to detect tilting or offset of the tray,
wherein the detection sensor includes at least one of a first detection sensor configured to detect tilting of the tray based on a first axis (X axis) parallel to a horizontal plane, a second detection sensor configured to detect tilting of the tray based on a second axis (Y axis) parallel to the horizontal plane, and a third detection sensor configured to detect movement of the tray in the direction of the first axis (X axis),
wherein the third detection sensor includes a third tray detection sensor configured to detect a horizontal distance to one lateral surface of the tray and a third chamber detection sensor configured to detect a horizontal distance to one lateral surface of an outside of the chamber.

14. The substrate processing apparatus of claim 13, wherein a third distance between the one lateral surface of the tray and an inner wall of the processing space is calculated using [Equation 2] below, $$\text{Third distance} = \text{ninth distance} - (\text{tenth distance} + \text{eleventh distance}) \quad \text{[Equation 2]}$$

where the ninth distance corresponds to a horizontal distance to the one lateral surface of the tray measured by the third tray detection sensor, the tenth distance corresponds to a horizontal distance to the one lateral surface of the outside of the chamber measured by the third chamber detection sensor, and the eleventh distance corresponds to a thickness of a lateral wall of the chamber;
the substrate processing apparatus further includes a controller; and
the controller determines whether the tray is tilted based on the first axis (X axis) by comparing the calculated third distance with a predetermined critical range.

* * * * *